United States Patent
Nakata et al.

(10) Patent No.: US 6,727,515 B2
(45) Date of Patent: Apr. 27, 2004

(54) INSULATION FILM FORMING MATERIAL, INSULATION FILM, METHOD FOR FORMING THE INSULATION FILM, AND SEMICONDUCTOR DEVICE

(75) Inventors: Yoshihiro Nakata, Kawasaki (JP); Katsumi Suzuki, Kawasaki (JP); Iwao Sugiura, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 10/102,723

(22) Filed: Mar. 22, 2002

(65) Prior Publication Data

US 2003/0089903 A1 May 15, 2003

(30) Foreign Application Priority Data

Nov. 2, 2001 (JP) ........................................ 2001-338502

(51) Int. Cl.[7] .............................................. H01L 35/24
(52) U.S. Cl. .................. 257/40; 257/758; 257/759; 257/632; 257/642; 257/643; 257/651; 438/1; 438/99; 438/780; 438/781; 438/783
(58) Field of Search ................ 257/40, 65, 758, 257/759, 632, 642, 643, 651; 438/1, 99, 780, 781, 783

(56) References Cited

U.S. PATENT DOCUMENTS

| | | | | |
|---|---|---|---|---|
| 5,804,508 A | * | 9/1998 | Gnade et al. ............. | 438/778 |
| 6,063,714 A | * | 5/2000 | Smith et al. ............. | 438/778 |
| 6,074,695 A | | 6/2000 | Kobayashi et al. | |
| 6,149,966 A | | 11/2000 | Kobayashi et al. | |
| 6,204,202 B1 | * | 3/2001 | Leung et al. ............. | 438/781 |
| 6,218,318 B1 | * | 4/2001 | Ohkura et al. ............ | 438/782 |
| 6,602,806 B1 | * | 8/2003 | Xia et al. ................ | 438/786 |

FOREIGN PATENT DOCUMENTS

| | | |
|---|---|---|
| JP | Hei 10209142 | 8/1998 |
| JP | Hei 11050007 | 2/1999 |
| JP | 2000-191822 | 7/2000 |
| JP | 2000-273176 | 10/2000 |

* cited by examiner

Primary Examiner—Minh Loan Tran
Assistant Examiner—Remmon R. Forde
(74) Attorney, Agent, or Firm—Arent Fox Kintner Plotkin & Kahn

(57) ABSTRACT

Porous insulation films 28, 40, 50 are formed of an insulation forming material including a silicon compound having a skeleton containing C—C bonds, a pore forming compound which is decomposed or evaporated by a heat treatment, and a solvent which dissolves the silicon compound with the pore forming compound, whereby the porous insulation film can have good mechanical strength and low dielectric constant.

21 Claims, 6 Drawing Sheets

INSULATION FILM FORMING MATERIAL, INSULATION FILM, METHOD FOR FORMING THE INSULATION FILM, AND SEMICONDUCTOR DEVICE

CROSS-REFERENCE TO RERATED APPLICATIONS

This application is based upon and claims priority of Japanese Patent Application No. 2001-338502, filed on Nov. 2, 2001, the contents being incorporated herein by reference.

BACKGROUND OF THE INVENTION

The present invention relates to an insulation film material which can form a porous insulation film of high mechanical strength and low dielectric constant, an insulation film, method for forming the insulation film, and a semiconductor device.

Recently, with increased integration degrees and increased element densities of semiconductor integrated circuits, higher layer multiplication of semiconductor elements is increasingly required. Such increased integration of semiconductor integrated circuits increases capacitances among interconnections of semiconductor elements, which lowers signal propagation speed. The interconnection delay in the interconnections has become a conspicuous problem.

So far in the generation of above 1 μm-interconnect ion gaps of semiconductor devices, the interconnection delay has not generally much influenced the devices. However, when the interconnection gaps become below 1 μm as semiconductor integrated circuits are more integrated, the influence of the interconnection delay on the device velocity cannot be bypassed. Especially in circuits which will have interconnection gaps of below 0.5 μm, the interconnection delay caused by parasitic capacities among interconnections will have much influence on the device velocity.

Generally is known that an interconnection delay T is influenced by an interconnection resistance R and an interconnection capacitance C and expressed by the following formula.

$$T \propto CR$$

An interconnection capacitance C is expressed by the following formula where an electrode area is represented by S; an interconnection gap, d; vacuum dielectric constant, $\epsilon_0$; and an interconnection insulation film dielectric constant, $\epsilon_r$.

$$C = \frac{\epsilon_0 \epsilon_r S}{d}$$

Thus, in order to reduce the interconnection delay it is found effective means to lower a dielectric constant of the interconnection insulation film.

Conventionally, in semiconductor integrated circuits, materials of the interconnection insulation film have been silicon dioxide $SiO_2$, silicon nitride SiN, phospho silicate glass PSG, etc. have been used. Silicon oxide film, which is the most popular in semiconductor devices, and which is formed by chemical vapor deposition (CVD) has an about 4 of dielectric constant.

Furthermore, for lower dielectric constants of the interconnection insulation film, uses of fluorine-added silicon oxide film (SiOF film) and organic polymers, such as polyimide, etc. are considered. The use of silica-based porous films having a number of pores formed in the films for lower dielectric constants as the interconnection insulation film is considered.

However, SiOF films formed by CVD have dielectric constant values ranging from about 3.3 to 3.5 and it is difficult to form SiOF films of dielectric constant values of below 3. When SiOF films are used as the interconnection insulation film, the interconnection capacitance cannot be sufficiently reduced. SiOF films have high hygroscopicity and often have increased dielectric constants after formed.

On the other hand, organic polymers, such as polyimide, etc. have low dielectric constants ranging from about 2 to 3. However, organic polymers are insufficient in heat resistance and adhesion and have restricted fabrication processes for semiconductor devices.

In the above-described background, in order to realize the required low dielectric constants, silica-based porous film will be prospective. Silica-based porous film has pores formed by applying to a substrate a material including a siloxane resin and a pyrolytic resin and sintering the material.

However, in the silica-based porous film, when a pore volume in the film is increased for lower dielectric constant, the film has the mechanical strength extremely lowered. In order to form a porous film of, e.g., a below 2.0– dielectric constant, a porosity of the film must be above 50%. Disadvantageously, the film tends to be broken in the processes of chemical mechanical polishing (CMP), etc. The film has also a disadvantage of high hygroscopicity. Accordingly, silica-based porous film cannot have sufficient properties for forming insulation films of low dielectric constants which are essential to realize high-velocity semiconductor devices.

SUMMARY OF THE INVENTION

An object of the present invention is to provide an insulation film material which can form a porous insulation film of high mechanical strength and low dielectric constant, an insulation film, method for forming the insulation film, and a semiconductor device.

According to one aspect of the present invention, there is provided an insulation film forming material comprising: a silicon compound having a skeleton of C—C bonds; a porous forming compound which is decomposed or evaporated by a heat treatment; and a solvent which dissolves the silicon compound with the porous forming material.

According to another aspect of the present invention, there is provided an insulation film comprising a film of a silicon compound having a skeleton containing C—C bonds, wherein pores of below 10 nm-size are formed in the film.

According to farther another aspect of the present invention, there is provided a method for forming an insulation film comprising the steps of: applying to a substrate an insulation film forming material including a silicon compound having a skeleton containing C—C bonds, a pore forming compound which is decomposed or evaporated by a heat treatment and a solvent which dissolves the silicon compound and the pore forming compound; drying the insulation film forming material applied to the substrate to form a film containing the silicon compound and the pore forming compound; and decomposing or evaporating the pore forming compound by subjecting the substrate to the heat treatment to eliminate the pore forming compound from the film to form pores in the film.

According to farther another aspect of the present invention, there is provided a semiconductor device comprising a porous insulation film comprising a film of a silicon compound having a skeleton containing C—C bonds formed on a semiconductor substrate, wherein pores of below 10 nm-size are formed in the film.

As described above, according to the present invention, a porous insulation film is formed of an insulation film forming material including a silicon compound having a skeleton containing C—C bonds, a pore forming compound which is decomposed or evaporated by a heat treatment, a solvent for dissolving the silicon compound and the pore forming compound, whereby the porous insulation film can have good mechanical strength and low dielectric constant.

DETAILED DESCRIPTION OF THE INVENTION

Figure 1A:
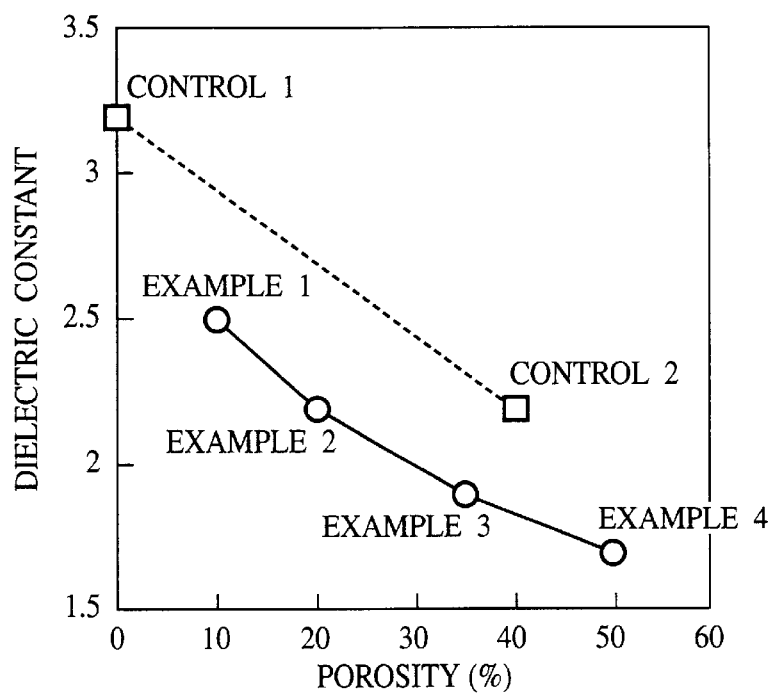
FIGS. 1A and 1B are graphs of relationships among porosities, dielectric constants and mechanical strengths of porous insulation films formed of the insulation film forming material according to examples of the present invention (Part 1).

The insulation film forming material according to the present invention is characterized mainly by including a silicon compound having a skeleton containing C—C bonds, a pore forming compound which is decomposed or evaporated with a heat treatment, and a solvent for dissolving the silicon compound and the pore forming compound.

Inter-layer insulation films for the interconnection layers of semiconductor devices are required to have low dielectric constants for the purpose of reducing the parasitic capacity among the interconnections and depressing generation of interconnection delay.

Silica-based porous insulation films formed of siloxane resins and pyrolytic resins can realize low dielectric constants by forming pores in the films. The porous insulation films can be insulation films of lower dielectric constants by increasing pore volumes in the films, i.e. by increasing porosities of the films. However, increase of porosities of the films lowers mechanical strengths thereof. This has made it difficult to use CMP, which exerts large mechanical loads. The silica-based porous insulation films have thus restricted fabrication processes for semiconductor devices. As a result, even the porous insulation films have not been able to be insulation films of semiconductor devices of sufficiently lower dielectric constants.

The inventors of the present invention have so far made earnest studies of insulation film forming materials which will substitute siloxane resin. As a result, the inventors have found that a silicon compound having a skeleton containing C—C bonds has a silicon atom to oxygen atom ratio of 1:0–0.5, whereby a film of a below 2.6 dielectric constant can be produced. They have found that such substrate, which itself has low dielectric constant, can have low dielectric constant even when a porosity is low, whereby decrease of the film strength with increase of the porosity can be depressed. It has been also found that the porous insulation film formed of such silicon compound have characteristics of high humidity resistance and chemical resistance.

Then, in the present invention, a porous insulation film is formed of the above-described silicon compound having a skeleton containing C—C bonds, whereby the porous insulation film can have low dielectric constant and high mechanical strength.

The insulation film forming material according to the present invention will be explained below. In the specification of the present application, "a substrate" means not only a semiconductor substrate itself, but also a semiconductor substrate with transistors, interconnection layers, etc. formed on.

The insulation film forming material according to the present invention includes a silicon compound having a skeleton containing C—C bonds, a pore forming compound which functions as an elimination agent for forming pores in the film, and a diluent for both compounds. The respective components of the insulation forming material according to the present invention will be detailed below.

The silicon compound having a skeleton containing C—C bonds can be, e.g., poly(dimethylcarbosilane), poly(hydromethylcarbosilane), poly(diethylcarbosilane), poly(hydroethylcarbosilane), poly(carbosilastyrene), poly(phenylmethylcarbosilane), poly(diphenylcarbosilane), poly(dimethylsilphenylenesiloxane), poly(methylsilphenylenesiloxane), poly(diethylsilphenylenesiloxane), poly(ethylsilphenylenesiloxane), poly(dipropylsilphenylenesiloxane), poly(propylsilphenylenesiloxane), poly(phenylsilphenylenesiloxane), poly(phenysilphenylenesiloxane), poly(phenylmethylsilphenylenesiloxane), poly(phenylethylsilphenylenesiloxane), poly(phenylpropylsilphenylenesiloxane), poly(ethylmethylsilphenylenesiloxane), poly(methylpropylsilphenylenesiloxane), poly(ethylpropylsilphenylenesiloxane), or others.

The silicon compound preferably has the structure expressed by the following general formula.

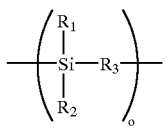

(Either of $R_1$ and $R_2$ is hydrogen, and the other is hydrocarbon having 1–3 carbon atoms or a phenyl group. $R_3$ is hydrocarbon having 1–3 carbon atoms or a phenylene group, or oxygen. o is an integer of 20–1000.) It is preferable that the silicon compound has hydrogen in the side chains. The side chains enable the silicon compound to react with the amine compound having 4 or more carbon atoms as the pore forming compound which will be described below to form micronized pores in the film.

The pore forming compound is not especially limited as long as it is an amine compound having 4 or more carbon atoms, and can be, e.g., aminobutane, diaminobutane, cyclohexylamine, dicyclohexylamine, tetramethylammoniun hydride, hexamethylammonium hydride, hexadecylammonium hydride, or others. Preferably, quaternary amine, whose reactivity with silicon-hydrogen bonds is high, is used.

As the pore forming compound, a generally used elimination agent, such as polyethylene resin or others may be used.

The diluent is not especially limited as long as the diluent can dissolve the above-described silicon compound and the pore forming compound. The diluent can be, e.g., cyclohexanone, methyl isobutyl ketone, methyl ethyl ketone, methyl cellosolve, ethyl cellosolve, octane, decane, propylene glycol, propylene glycol monomethyl ether, propylene glycol monomethyl ether acetate, diethylene glycol, propylene glycol, propylene glycol monomethyl ether, propylene glycol monoethyl ether, propylene glycol monopropylether, or others.

Next, the method for forming the insulation film according to the present invention will be explained.

First, the insulation film forming material according to the present invention will be applied, by, e.g., spin coating, to a substrate for the porous insulation film to be formed on.

Next, the substrate with the insulation film forming material applied to is annealed at, e.g., 50–350° C. Thus, the solvent is evaporated and the pore forming compound is partially eliminated by heating.

Then, the porous insulation film formed on the substrate is heat-treated at, e.g., 300–500° C. in an atmosphere of a 5% oxygen concentration. Thus, the formation of the porous insulation film is completed.

As described above, the thus formed porous insulation film has characteristics of high chemical resistance to acid and alkaline chemicals, etc., and high humidity resistance. A dielectric constant value of the porous insulation film is below 2.0 even when a porosity of the porous insulation film is about 30%. Accordingly, in comparison with the conventional silica-based porous insulation film, the porous insulation film has smaller strength reduction due to the pores in the porous insulation film.

The above-described the insulation film forming method is applicable to forming inter-layer insulation film, etc. of semiconductor devices of multi-interconnection layer structure.

As described above, according to the present embodiment, as a material of the porous insulation film a silicon compound having a skeleton containing C—C bonds is used, whereby the porous insulation film of low dielectric constant can have high mechanical strength, and high chemical resistance and high humidity resistance.

EXAMPLES

Example 1

Methylhydropolycarbosilane is dissolved by 10% in 90 g of methyisobutylketone to be loaded in a 300 ml-three-necked flask equipped with a Dimroth condenser and agitating blades. An aqueous solution of 5% tetramethyl ammonium hydride was dropped in the solution by 20 g at 40° C. After the drop, the solution was left at 40° C. for 2 hours and was cooled to the room temperature. Then magnesium sulfate was added by 30 g and dehydrated. Thus, the insulation film forming material was prepared.

Example 2

Methylhydropolycarbosilane is dissolved by 10% in 90 g of methyisobutylketone to be loaded in a 300 ml-three-necked flask equipped with a Dimroth condenser and agitating blades. An aqueous solution of 5% tetramethyl ammonium hydride was dropped in the solution by 40 g at 40° C. After the drop, the solution was left at 40° C. for 2 hours and was cooled to the room temperature. Then magnesium sulfate was added by 30 g and dehydrated. The insulation film forming material was prepared in the same way as in Example 1 except that the aqueous solution of tetramethyl ammmonium hydride which was dropped by 20 g in Example 1 was dropped by 40 g.

Example 3

Methylhydropolycarbosilane is dissolved by 10% in 90 g of methyisobutylketone to be loaded in a 300 ml-three-necked flask equipped with a Dimroth condenser and agitating blades. An aqueous solution of 5% tetramethyl ammonium hydride was dropped in the solution by 60 g at 40° C. After the drop, the solution was left at 40° C. for 2 hours and was cooled to the room temperature. Then magnesium sulfate was added by 30 g and dehydrated. The insulation film forming material was prepared in the same way as in Example 1 except that the aqueous solution of tetramethyl ammmonium hydride which was dropped by 20 g in Example 1 was dropped by 60 g.

Example 4

Methylhydropolycarbosilane is dissolved by 10% in 90 g of methyisobutylketone to be loaded in a 300 ml-three necked flask equipped with a Dimroth condenser and agitating blades. An aqueous solution of 5% tetramethyl ammonium hydride was dropped in the solution by 100 g at 40° C. After the drop, the solution was left at 40° C. for 2 hours and was cooled to the room temperature. Then magnesium sulfate was added by 30 g and dehydrated. The insulation film forming material was prepared in the same way as in Example 1 except that the aqueous solution of tetramethyl ammmonium hydride which was dropped by 20 g in Example 1 was dropped by 100 g.

Example 5

Methylhydropolycarbosilane is dissolved by 10% in 90 g of methyisobutylketone to be loaded in a 300 ml-three-necked flask equipped with a Dimroth condenser and agitating blades. A methylisobutylketone solution of 5% polystyrene resin was dropped in the solution by 20 g at 40° C. After the drop, the solution was left at 40° C. for 2 hours and was cooled to the room temperature. Thus, the insulation film forming material was prepared.

Example 6

Methylhydropolycarbosilane is dissolved by 10% in 90 g of methyisobutylketone to be loaded in a 300 ml-three-necked flask equipped with a Dimroth condenser and agitating blades. A methylisobutylketone solution of 5% polystyrene resin was dropped in the solution by 40 g at 40° C. After the drop, the solution was left at 40° C. for 2 hours and was cooled to the room temperature. The insulation film forming material was prepared in the same way as in Example 5 except that the methylisobutylketone solution of 5% polystyrene resin which was dropped by 20 g in Example 1 was dropped by 40 g.

Example 7

Methylhydropolycarbosilane is dissolved by 10% in 90 g of methyisobutylketone to be loaded in a 300 ml-three-necked flask equipped with a Dimroth condenser and agitating blades. A methylisobutylketone solution of 5% polystyrene resin was dropped in the solution by 60 g at 40° C. After the drop, the solution was left at 40° C. for 2 hours and was cooled to the room temperature. The insulation film forming material was prepared in the same way as in Example 5 except that the methylisobutylketone solution of 5% polystyrene resin which was dropped by 20 g in Example 1 was dropped by 60 g.

Example 8

Methylhydropolycarbosilane is dissolved by 10% in 90 g of methyisobutylketone to be loaded in a 300 ml-three-necked three-necked flask equipped with a Dimroth condenser and agitating blades. A methylisobutylketone solution of 5% polystyrene resin was dropped in the solution by 100 g at 40° C. After the drop, the solution was left at 40° C. for 2 hours and was cooled to the room temperature. The insulation film forming material was prepared in the same way as in Example 5 except that the methylisobutylketone solution of 5% polystyrene resin which was dropped by 20 g in Example 1 was dropped by 100 g.

Control 1

20.8 g (0.1 mol) of tetraethoxysilane, 17.8 g (0.1 mol) of methyltriethoxysilane, 39.6 g of methyisobutylketone were loaded in a 200 ml-reaction vessel, and 400 ppm-aqueous nitric acid was dropped by 16.2 g (0.9 mol) for 10 minutes. After the drop of the aqueous nitric acid, a 2 hour-maturing reaction was made. Then, magnesium sulfate was added by 5 g, and excessive water was removed. Then, ethanol produced by the maturing reaction was removed by a rotary evaporator until the reaction liquid becomes 50 ml. Thus, the insulaion film forming material of siloxane resin was prepared.

Control 2

20.8 g (0.1 mol) of tetraethoxysilane, 17.8 g (0.1 mol) of methyltriethoxysilane, 39.6 g of methyisobutylketone were loaded in a 200 ml-reaction vessel, and 400 ppm-aqueous nitric acid was dropped by 16.2 g for 10 minutes. After the drop of the aqueous nitric acid, a 2 hour-maturing reaction was made. Then, magnesium sulfate was added by 5 g, and excessive water was removed. Then, ethanol produced by the maturing reaction was removed by a rotary evaporator until the reaction liquid becomes 50 ml. A 5% polystyrene solution of methylbutylketone was dropped in this solution by 100 g at 40° C. After the drop, the solution was left at 40° C. for 2 hours and then was cooled to the room temperature. Thus, the insulation film forming material of siloxane resin was prepared.

Dielectric Constant and Mechanical Strength Measurement

Porous insulation films were formed of the insulation film forming materials prepared in Examples 1 to 8 and Controls 1 and 2. Dielectric constants of the respective porous insulation films, and relationships between mechanical strength and porosity of the respective porous insulation films were measured.

The porous insulation films for measuring dielectric constants and mechanical strength were formed as follows:

The insulation film forming materials were applied to silicon wafers by spin coating at a 3000 rotation number for 20 seconds. Then, the solvent was dried at 200° C., and next the silicon wafers were sintered at 200° C. for 30 minutes in a nitrogen atmosphere of a 5000 ppm-oxygen concentration. Thus, the porous insulation films were formed on the silicon substrates.

Dielectric Constant Measurement

A 1 mm Au-electrode was formed on the porous insulation film thus formed of the respective insulation film forming materials, and capacitances and voltage characteristics were measured to compute dielectric constant values.

FIG. 1A is a graph of the dielectric constant values computed on the porous insulation films formed of the insulation film forming materials according to Examples 1 to 4 plotted with respect to porosities.

Figure 2A:
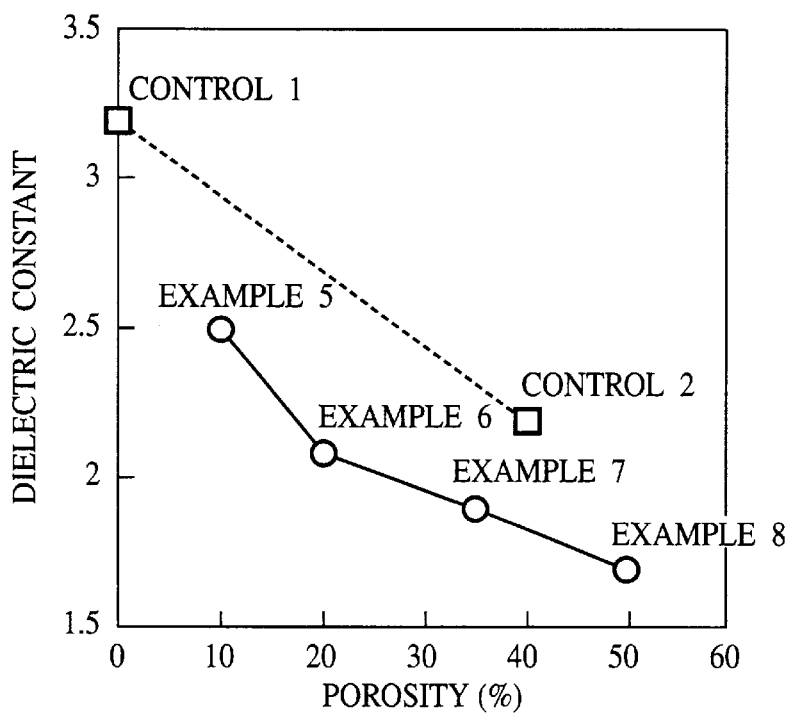
FIGS. 2A and 2B are graphs of relationships among porosities, dielectric constants and mechanical strengths of porous insulation films formed of the insulation film forming material according to examples of the present invention (Part 2).

FIG. 2A is a graph of dielectric constant values computed on the porous insulation films formed of the insulation film forming materials of Examples 5 to 8 plotted with respect to porosities of the porous insulation films.

As evident in the graphs shown in FIGS. 1A and 2A, a result is that the porous insulation forming materials of the respective examples have lower dielectric constants for substantially the same porosity in comparison with the porous insulation film forming materials of the controls.

Mechanical Strength Measurement

A 100 nm-plasma silicon nitride film is formed as a cap film on the porous insulation films formed of the insulation films of the respective examples, and a stud-pull test was made to measure mechanical strength of the porous insulation films.

Figure 1B:
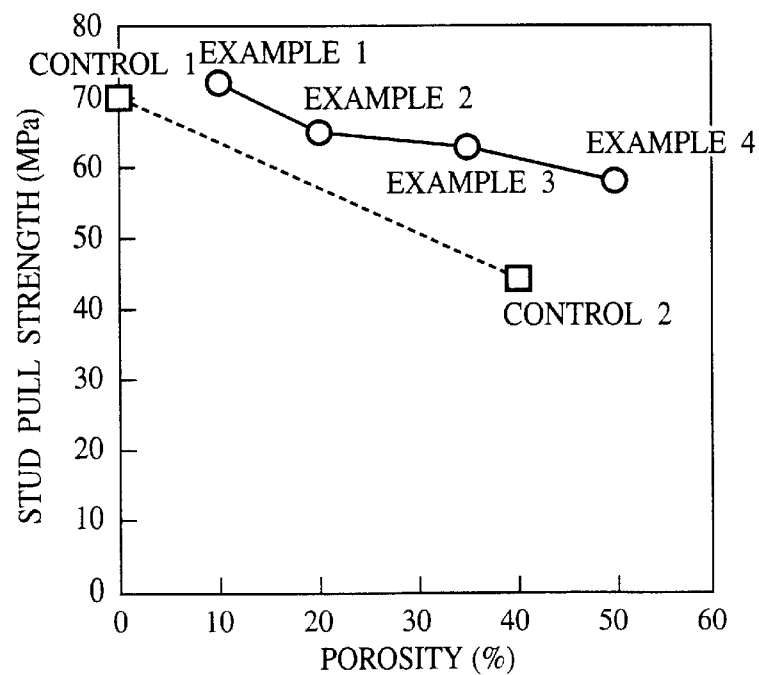

FIG. 1B is a graph of mechanical strengths measured on the porous insulation films formed of the insulation film forming materials of Examples 1 to 4 plotted with respect to porosity of the porous insulation film.

Figure 2B:
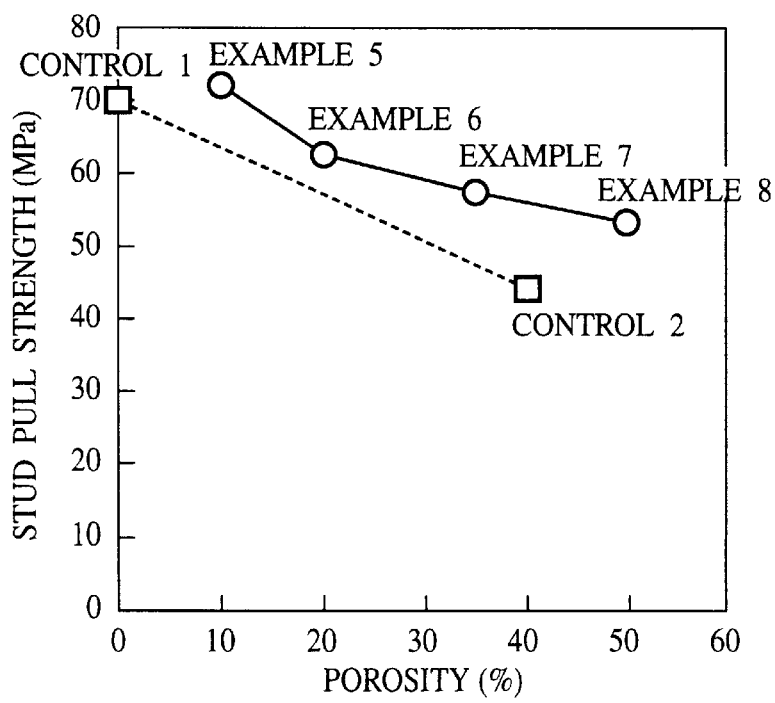

FIG. 2B is a graph of mechanical strengths measured on the porous insulation films formed of the insulation film forming materials of Examples 5 to 8 plotted with respect to porosities of the porous insulation films.

As evident in the graphs shown in FIGS. 1B and 2B, a result is that the porous insulation forming materials of the respective examples have higher mechanical strengths for substantially the same porosity in comparison with the porous insulation film forming materials of the controls.

Based on the above-described results, it was confirmed that the porous insulation film formed of the insulation forming material according to the present invention has higher mechanical strength even for high porosity, and lower dielectric constant in comparison with the conventional porous silica-based insulation film.

Semiconductor Device and Method for Fabricating the Semiconductor Device

Figure 3:
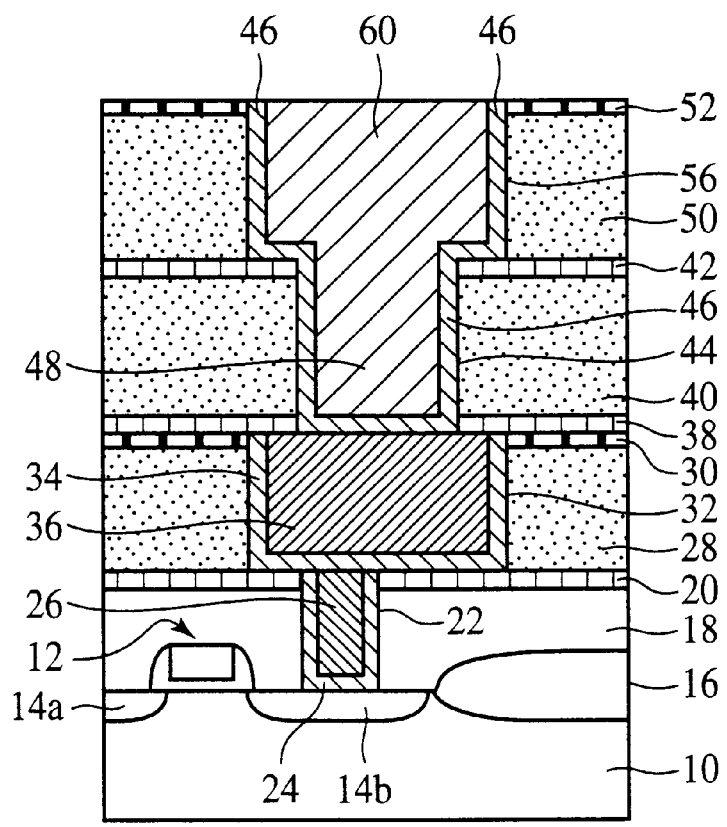
FIG. 3 is a sectional view of the semiconductor device using the porous insulation film formed of the insulation film forming material according to the present invention as inter-layer insulation films of a multi-interconnection layer structure, which shows a structure of the semiconductor device.

Next, a semiconductor device using the porous insulation film formed of the insulation film forming material according to the present invention as inter-layer insulation films, and the method for fabricating the semiconductor device will be explained with reference to FIGS. 3, 4A–4D, 5A, 5B, 6A, 6B. FIG. 3 is a sectional view of the semiconductor device using the porous insulation film formed of the insulation film forming material according to the present invention as inter-layer insulation films of a multi-interconnection layer structure, which shows a structure thereof. FIGS. 4A–4D, 5A, 5B, 6A, and 6B are sectional views of the semiconductor device using the porous insulation film formed of the insulation film forming material according to the present invention as inter-layer insulation films of a multi-interconnection layer structure in the steps of the method for fabricating the semiconductor device, which show the method.

First, the structure of the semiconductor device using the porous insulation film formed of the insulation film forming material according to the present invention as inter-layer insulation films will be explained with reference to FIG. 3.

As shown in FIG. 13, a gate electrode 12 is formed on a silicon wafer 10. Source/drain diffused layer 14a, 14b is formed in the silicon wafer 10 on both sides of the gate electrode 12. Thus, a transistor including the gate electrode 12 and the source/drain diffused layer 14a, 14b is formed. An element isolation film 16 for isolating the transistor is formed on the silicon wafer.

An inter-layer insulation film 18 and a stopper film 20 are formed in the stated order on the entire surface of the silicon wafer 10 with the thus-formed transistor formed on. A contact hole 22 is formed in the inter-layer insulation film 18 and the stopper film 20. A titanium nitride film 24 is formed in the contact hole 22, and a conductor plug 26 of tungsten is buried in the contact hole 22.

A porous insulation film 28 formed of the insulation forming material according to the present invention, and a cap film 30 are formed on the upper surface of the stopper film 20 in the stated order.

A first interconnection groove 32 of a first interconnection layer pattern, which is connected to the conductor plug 26 is formed in the porous insulation film 28 and the cap film 30. In the first interconnection groove 32, a titanium nitride film 34 is formed, and the first interconnection layer 36 of copper is buried.

A diffusion preventing film 38 of silicon nitride film, a porous insulation film 40 formed of the insulation film forming material according to the present invention, and a diffusion preventing film 42 of silicon nitride film are formed on the upper surface of the cap film 30 in the stated order.

A via hole 44 is formed in the porous insulation film 40 and the diffusion preventing film 42, connected to the first interconnection layer 36. In the via hole 44, a titanium nitride film 46, and a via layer 48 of copper is buried.

A porous insulation film 50 formed of the insulation film forming material according to the present invention, and a cap film 52 of silicon nitride film are formed on the upper surface of the diffusion preventing film 42 in the stated order.

A second interconnection groove 56 of a second interconnection layer pattern, which is connected to the via layer 48 is formed on the porous insulation film 50 and the cap layer 52. In the second interconnection groove 56, a titanium nitride film 46 is formed, and a second interconnection layer 60 of copper is buried.

Then, the method for fabricating the semiconductor device using the porous insulation film formed of the insulation film forming material according to the present invention as the inter-layer insulation films of the multi-interconnection layer structure will be explained with reference to FIGS. 4A–4D, 5A, 5B, 6A and 6B.

First, the inter-layer insulation film 18 and the stopper film 20 are by the usual semiconductor device process in the stated order on the silicon wafer 10 with the transistor including the gate electrode 12, the source/drain diffused layer 14a, 14b, and the element isolation film 16 formed on.

Next, the contact hole 22 is formed in the inter-layer insulation film 18 and the stopper film 20, connected to the drain diffused layer 14b.

Then, the titanium nitride film 24 of a 500 nm-thickness is formed in the contact hole 22 by sputtering. Next, $WF_6$ is mixed with hydrogen to be reduced to thereby bury the conductor plug 26 of the tungsten in the contact hole 22.

Figure 4A:
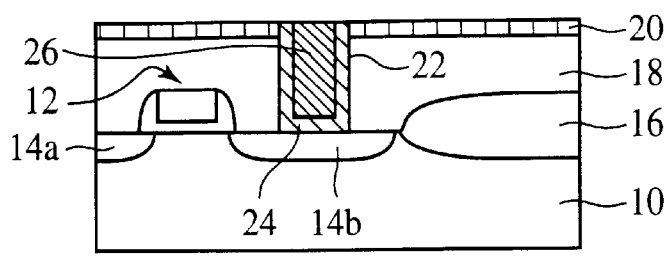
FIGS. 4A–4D are sectional views of the semiconductor device using the porous insulation film formed of the insulation film forming material according to the present invention as inter-layer insulation films of a multi-interconnection layer structure in the steps of the method for fabricating the semiconductor device, which explain the method (Part 1).
Figure 4B:
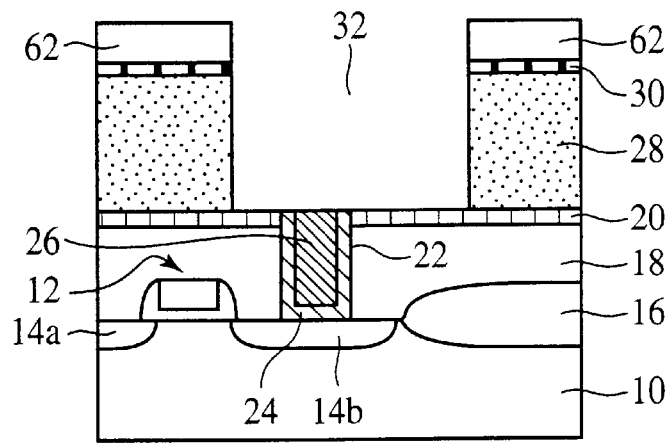

Next, the titanium nitride 24 except that in the contact hole 22 and the tungsten used in forming the conductor plug 26 are removed by CMP (FIG. 4A).

Next, the insulation film forming material according to the present invention is applied to the entire surface by spin coating at 3000 rotations for 20 seconds. Next, the solvent is dried at 200° C., and then the silicon wafer is sintered for 30 minutes. Thus, the porous insulation film 28 is formed in a 450 nm-thickness. Then, the cap film 30 is laid on the porous insulation film 28 of a 50 nm-thickness silicon oxide film by CVD using TEOS (TetraEthOxySilane) as a raw material.

Then, a resist film 62 for exposing a region for the first interconnection layer pattern to be formed in is formed on the cap film 30 by photolithography.

Next, with the patterned resist film 62 as a mask, the cap film 30 and the porous insulation film 28 are etched by RIE (Reactive Ion Etching) using $CF_4/CHF_3$.

Figure 4C:
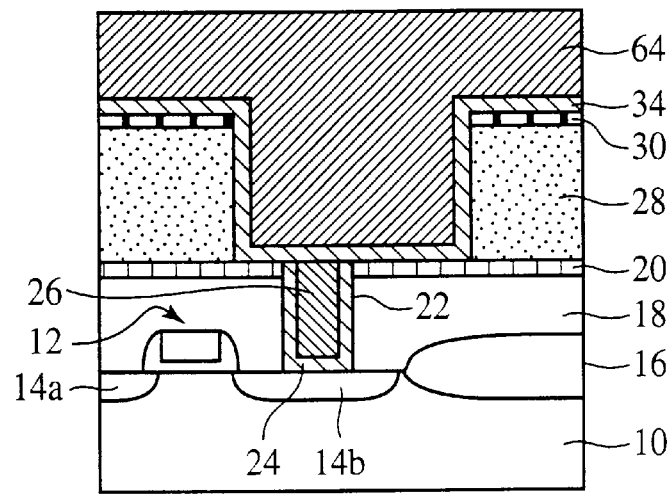

Then, a 50 nm-thickness titanium nitride film 34 and a 50 nm-thickness seed copper film (not shown) are formed on the entire surface respectively by sputtering. A 600 nm-thickness copper film 64 is formed on the seed copper film by electrolytic plating using the seed copper film as the electrode (FIG. 4C).

Figure 4D:
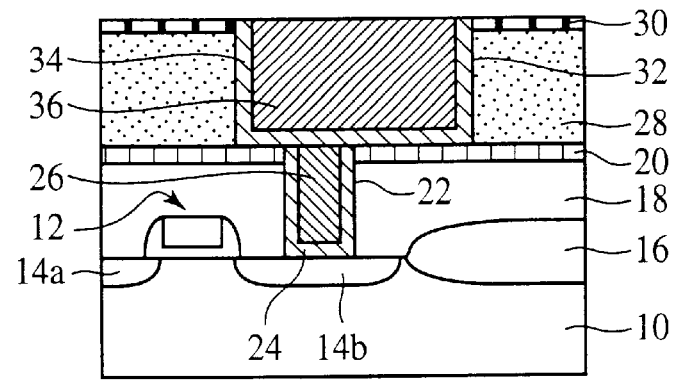

Next, the copper film 64 except that formed in the first interconnection groove 32, the seed copper film and the titanium nitride film 34 are removed by CMP. Here, the porous insulation film 28 of high mechanical strength formed by the insulation film forming method according to the present invention permits the copper film 64, etc. to be easily removed by CMP. Thus, the first interconnection layer 36 of the copper film 64 buried in the first interconnection groove 32 is formed (FIG. 4D).

The second interconnection layer 60, and the via layer 48 interconnecting the first interconnection layer 36 and the second interconnection layer 60 are concurrently formed by damascening.

First, the diffusion preventing film 38 of a 50 nm-thickness silicon nitride film is formed on the entire surface of the silicon wafer 10 with the first interconnection layer 36 formed on, by plasma CVD using silane and ammonium gas a raw materials.

Figure 5A:
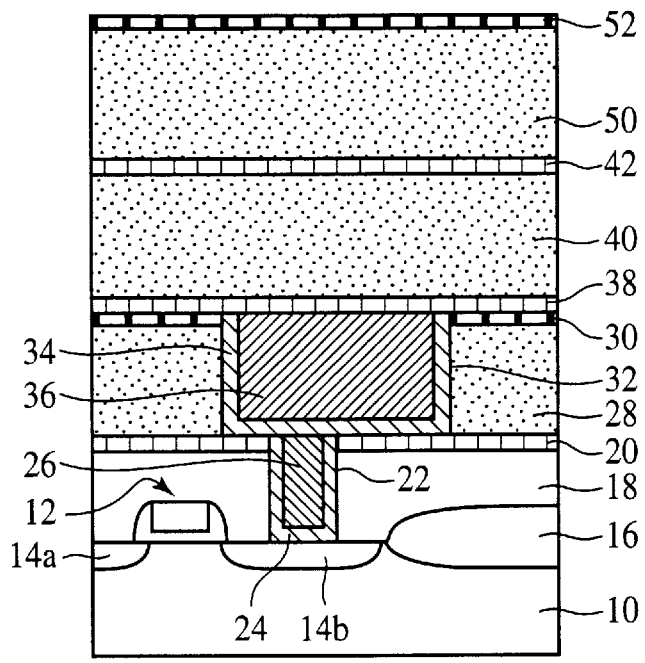
FIGS. 5A and 5B are sectional views of the semiconductor device using the porous insulation film formed of the insulation film forming material according to the present invention as inter-layer insulation films of a multi-interconnection layer structure in the steps of the method for fabricating the semiconductor device, which explain the method (Part 2).

Then, in the same was as in forming the porous insulation film 28, the porous insulation film 40 is formed of the insulation film forming material according to the present invention in a 650 nm-thickness on the diffusion preventing film 38. Next, the diffusion preventing film 42 is formed of silicon nitride film on the porous insulation film 40. Then, the porous insulation film 50 is formed of the insulation film forming material according to the present invention in a 450 nm-thickness on the diffusion preventing film 42. The cap film 52 of a 50 nm-thickness silicon nitride film is formed on the porous insulation film 50 by CVD using TEOS as a raw material (FIG. 5A).

Next, a resist film 66 for exposing a region for the via hole 44 to be formed in is formed on the cap film 52 by photolithography.

Figure 5B:
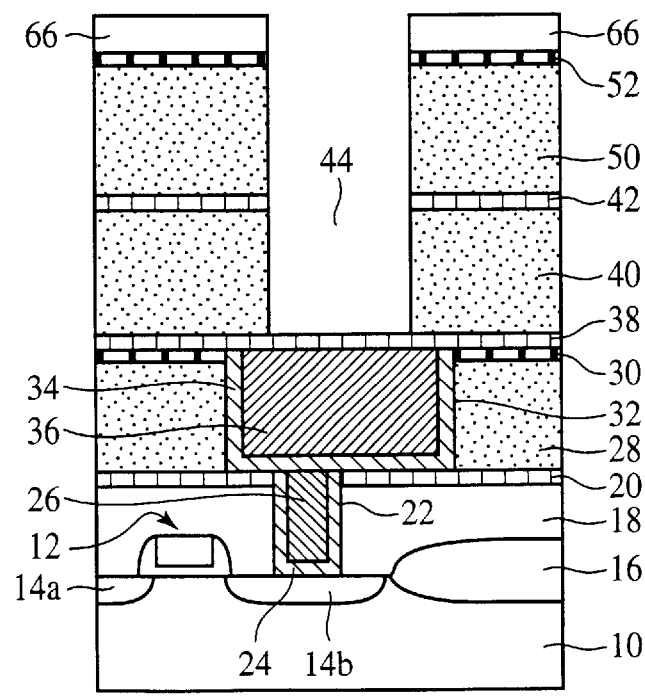

Then, with the patterned resist film 66 as a mask, the cap film 52, the porous insulation film 50, the diffusion preventing film 42, the porous insulation film 40 and the diffusion preventing film 38 are sequentially etched by RIE using $CF_4/CHF_3$. Thus, the via hole 44 is formed, connected to the first interconnection layer 36 (FIG. 5B). After the via hole 44 has been formed, the resist film 66 is removed.

Next, a resist film 60 for exposing a region for the second interconnection layer pattern to be formed in is formed on the entire surface by photolithography.

Figure 6A:
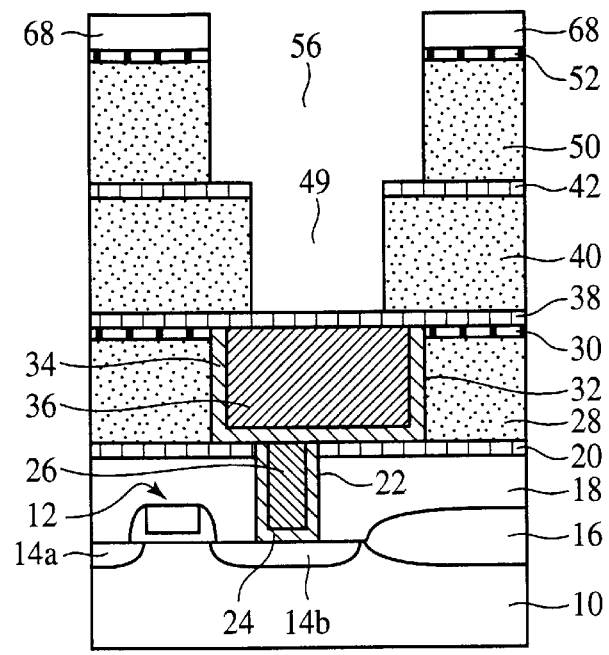
FIGS. 6A and 6B are sectional views of the semiconductor device using the porous insulation film formed of the insulation film forming material according to the present invention as inter-layer insulation films of a multi-interconnection layer structure in the steps of the method for fabricating the semiconductor device, which explain the method (Part 3).

Next, with the patterned resist film 68 as a mask, the cap film 52 and the porous insulation film 50 are sequentially etched by RIE using $CF_4/CHF_3$. Thus, the second interconnection groove 56 of the second interconnection layer pattern is formed (FIG. 6A). After the second interconnection groove 56 has been formed, the resist film 68 is removed.

Figure 6B:
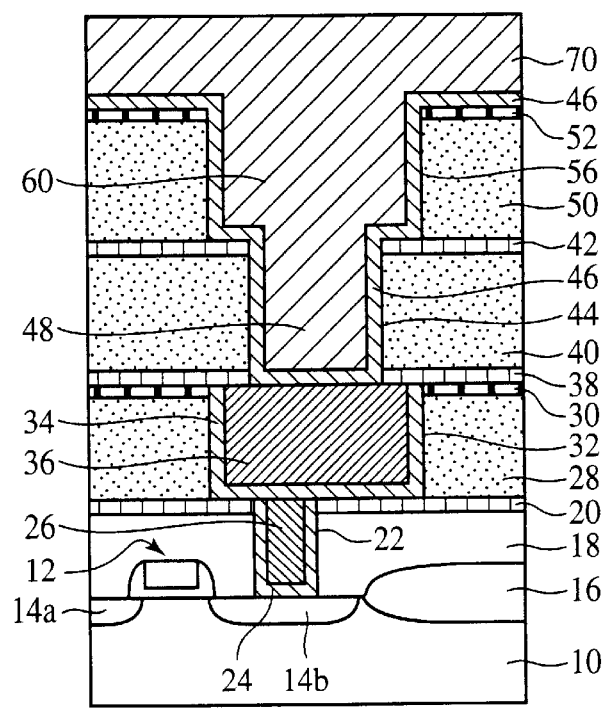

Then, a 50 nm-thickness titanium nitride film 46 and a 50 nm-thickness seed copper film (not shown) are sequentially formed on the entire surface respectively by sputtering. Then, a copper film 70 is formed on the seed copper film in a 600 nm-thickness by electrolytic plating using the seed copper film as the electrode (FIG. 6B).

Next, the copper film 70, the seed copper film and the titanium nitride film 46 except those in the via hole 44 and the interconnection groove 56 are removed by CMP. As in forming the first interconnection layer 36, the porous insulation films 50, 40 of high mechanical strength permit the copper film 70, etc. to be easily removed by CMP. Thus, the via layer 48 and the second interconnection layer 60 are concurrently formed of the copper film 70 buried in the via hole 44 and the second interconnection groove 56.

Hereafter, the above-described steps are repeated in accordance with a structure of a semiconductor device to be fabricated to thereby form multi-interconnection layers.

Multi-interconnection layers were formed, for tests, of the insulation film forming material of Example 3 by the above-described semiconductor device fabrication method. A result was that a yield of a million continuous vias was above 90%.

Multi-interconnection layers were formed, for tests, of the insulation film forming material of Example 7 by the above-described simiconductor device fabrication method. A result was that a yield of a million continuous vias was above 90%.

What is claimed is:

1. An insulation film forming material comprising:
   a silicon compound having a skeleton of C—C bonds;
   a porous forming compound which is decomposed or evaporated by a heat treatment; and
   a solvent which dissolves the silicon compound with the porous forming material.

2. An insulation film forming material according to claim 1, wherein
   the silicon compound has a structure expressed by the following general formula

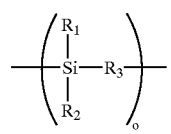

(Either of $R_1$ and $R_2$ is hydrogen, and the other is hydrocarbon having 1–3 carbon atoms or a phenyl group. $R_3$ is hydrocarbon having 1–3 carbon atoms or a phenylene group, or oxygen. o is an integer of 20–1000.)

3. An insulation film forming material according to claim 1, wherein the silicon compound has side chains containing hydrogen.

4. An insulation film forming material according to claim 1, wherein
   the silicon compound is one of poly(dimethylcarbosiloxane), poly(hydromethylcarbosilane), poly(diethylcarbosilane), poly(hydroethylcarbosilane), poly(carbosilastyrene), poly(phenylmethylcarbosilane), poly(diphenylcarbosilane), poly(dimethylsilphenylenesiloxane), poly(methylsilphenylene siloxane), poly(diethylsilphenylenesiloxane), poly(ethylsilphenylenesiloxane), poly(dipropylsilphenylenesiloxane) poly(propylsilphenylenesiloxane), poly(phenylsilphenylenesiloxane), poly(phenysilphenylenesiloxane), poly(phenylmethylsilphenylenesiloxane), poly(phenylethylsilphenlenesiloxane), poly(phenylpropylsilphenylenesiloxane), poly(ethylmethylsilphenylenesiloxane), poly(methylpropylsilphenylenesiloxane), and poly(ethylpropylsilphenylenesiloxane).

5. An insulation film forming material according to claim 1, wherein
   the pore forming compound is an amine compound having 4 or more carbon atoms.

6. An insulation film forming material according to claim 5, wherein
   the amine compound is one of aminobutane, diaminobutane, cyclohexylamine, dicyclohexylamine, tetramethylammoniun hydride, hexamethylammonium hydride, and hexadisilylammonium hydride.

7. An insulation film comprising a film of a silicon compound having a skeleton containing C—C bonds, wherein pores of below 10 nm-size are formed in the film.

8. An insulation film according to claim 7, wherein the silicon compound has a structure expressed by the following general formula

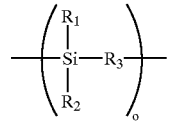

(Either of $R_1$ and $R_2$ is hydrogen, and the other is hydrocarbon having 1–3 carbon atoms or a phenyl group. $R_3$ is hydrocarbon having 1–3 carbon atoms or a phenylene group, or oxygen. o is an integer of 20–1000.)

9. An insulation film according to claim 7, wherein the silicon compound is one of poly(dimethylcarbosiloxane), poly(hydromethylcarbosilane), poly(diethylcarbosilane), poly(hydroethylcarbosilane), poly(carbosilastyrene), poly(phenylmethylcarbosilane), poly(diphenylcarbosilane), poly(dimethylsilphenylenesiloxane), poly(methylsilphenylene siloxane), poly(diethylsilphenylenesiloxane), poly(ethylsilphenylenesiloxane), poly(dipropylsilphenylenesiloxane), poly(propylsilphenylenesiloxane), poly(phenylsilphenylenesiloxane), poly(phenysilphenylenesiloxane), poly(phenylmethylsilphenylenesiloxane), poly(phenylethylsilphenylenesiloxane), poly(phenylpropylsilphenylenesiloxane), poly(ethylmethylsilphenylnesiloxane), poly(methylpropylsilphenylenesiloxane), and poly(ethylpropylsilphenylenesiloxane).

10. An insulation film according to claim 7, wherein a ratio of oxygen atom to silicon atom in the skeleton of the film is in the range of 1 silicon atom to 0–0.5 oxygen atom.

11. A method for forming an insulation film comprising the steps of:
applying to a substrate an insulation film forming material according to claim 1 including a silicon compound having a skeleton containing C—C bonds, a pore forming compound which is decomposed or evaporated by a heat treatment and a solvent which dissolves the silicon compound and the pore forming compound;
drying the insulation film forming material applied to the substrate to form a film containing the silicon compound and the pore forming compound; and
decomposing or evaporating the pore forming compound by subjecting the substrate to the heat treatment to eliminate the pore forming compound from the film to form pores in the film.

12. A method for forming an insulation film according to claim 11, wherein the silicon compound has a structure expressed by the following general formula

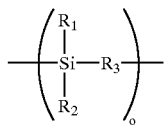

(Either of $R_1$ and $R_2$ is hydrogen, and the other is hydrocarbon having 1–3 carbon atoms or a phenyl group. $R_3$ is hydrocarbon having 1–3 carbon atoms or a phenylene group, or oxygen. o is an integer of 20–1000.)

13. A method forming an insulation film according to claim 11, wherein the silicon compound is one of poly(dimethylcarbosiloxane), poly(hydromethylcarbosilane), poly(diethylcarbosilane), poly(hydroethylcarbosilane), poly(carbosilastyrene), poly(phenylmethylcarbosilane), poly(diphenylcarbosilane), poly(dimethylsilphenylenesiloxane), poly(methylsilphenylene siloxane), poly(diethylsilphenylenesiloxane), poly(ethylsilphenylenesiloxane), poly(dipropylsilphenylenesiloxane), poly(propylsilphenylenesiloxane) poly(phenylsilphenylenesiloxane), poly(phenysilphenylenesiloxane), poly(phenylmethylsilphenylenesiloxane), poly(phenylethylsilphenylenesiloxane), poly(phenylpropylsilphenylenesiloxane), poly(ethylmethylsilphenylenesiloxane), poly(methylpropylsilphenylenesiloxane), and poly(ethylpropylsilphenylenesiloxane).

14. A method for forming an insulation film according to claim 11, wherein
a concentration of the pore forming compound in the insulation film forming material is adjusted to thereby control a porosity of the film.

15. An insulation film forming method according to claim 11, wherein
the pore forming compound is an amine compound containing 4 or more carbon atoms, and
the substrate with the film formed on is subjected to a heat treatment in an atmosphere of a below 5% oxygen concentration at 300–500° C. to form the pores in the film.

16. A semiconductor device comprising a porous insulation film comprising a film of a silicon compound having a skeleton containing C—C bonds formed on a semiconductor substrate, wherein pores of below 10 nm-size are formed in the film.

17. A semiconductor device according to claim 16, further comprising
a buried interconnection layer buried in the porous insulation film.

18. A semiconductor device according to claim 16, further comprising
a first interconnection layer formed above the semiconductor substrate, the porous insulation film formed on the first interconnection layer, and
a second interconnection layer formed on the porous insulation film.

19. A semiconductor device according to claim 16, wherein the silicon compound has a structure expressed by the following general fomula

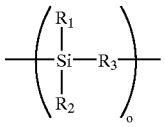

(Either of $R_1$ and R2 is hydrogen, and the other is hydrocarbon having 1–3 carbon atoms or a phenyl group. $R_3$ is hydrocarbon having 1–3 carbon atoms or a phenylene group, or oxygen. o is an integer of 20–1000.)

20. A semiconductor device according to claim 16, wherein the silicon compound is one of poly(dimethylcarbosiloxane), poly(hydromethylcarbosilane), poly(diethylcarbosilane), poly(hydroethylcarbosilane), poly(carbosilastyrene), poly(phenylmethylcarbosilane), poly(diphenylcarbosilane), poly(dimethylsilphenylenesiloxane), poly(methylsilphenylene siloxane), poly(diethylsilphenylenesiloxane), poly(ethylsilphenylenesiloxane), poly(dipropylsilphenylenesiloxane), poly(propylsilphenylenesiloxane), poly(phenylsilphenylenesiloxane), poly(phenysilphenylenesiloxane), poly(phenylmethylsilphenylenesiloxane), poly(phenylethylsilphenylenesiloxane), poly(phenylpropylsilphenylenesiloxane), poly(ethylmethylsilphenylenesiloxane), poly(methylpropylsilphenylenesiloxane), and poly(ethylpropylsilphenylenesiloxane).

21. A semiconductor device according to claim 16, wherein a ratio of oxygen atom to silicon atom in the skeleton of the film of the porous insulation film is in the range of 1 silicon atom to 0–0.5 oxygen atom.

* * * * *

UNITED STATES PATENT AND TRADEMARK OFFICE
CERTIFICATE OF CORRECTION

PATENT NO. : 6,727,515 B2
APPLICATION NO. : 10/102723
DATED : April 27, 2004
INVENTOR(S) : Nakata et al.

Page 1 of 1

It is certified that error appears in the above-identified patent and that said Letters Patent is hereby corrected as shown below:

Column 12-

Line 23, delete "(dimethylcarbosiloxane)" and substitute therfor -- (dimethylcarbosilane) --.

Column 13-

Line 3, delete "(dimethylcarbosiloxane)" and substitute therefor -- (dimethylcarbosilane) --;

Line 53, delete "(dimethylcarbosiloxane)" and substitute therefor -- (dimethylcarbosilane) --;

Column 14-

Line 47, delete "(dimethylcarbosiloxane)" and substitute therefor -- (dimethylcarbosilane) --;

Signed and Sealed this

Twenty-second Day of August, 2006

JON W. DUDAS
*Director of the United States Patent and Trademark Office*